United States Patent [19]

Taniguchi

[11] Patent Number: 5,316,982
[45] Date of Patent: May 31, 1994

[54] SEMICONDUCTOR DEVICE AND METHOD FOR PREPARING THE SAME

[75] Inventor: Kouji Taniguchi, Nara, Japan

[73] Assignee: Sharp Kabushiki Kaisha, Osaka, Japan

[21] Appl. No.: 889,413

[22] Filed: May 28, 1992

[30] Foreign Application Priority Data

Oct. 18, 1991 [JP] Japan .................................. 3-271409

[51] Int. Cl.$^5$ ............................................ H01L 21/02
[52] U.S. Cl. ...................................... 437/236; 437/247
[58] Field of Search ................................ 437/236, 247

[56] References Cited

U.S. PATENT DOCUMENTS

| | | | |
|---|---|---|---|
| 4,053,335 | 10/1977 | Hu | 437/142 |
| 4,437,139 | 3/1984 | Howard | 437/235 |
| 4,891,684 | 1/1990 | Nishioka et al. | 437/919 |
| 5,079,191 | 1/1992 | Shinriki et al. | 437/235 |
| 5,138,432 | 8/1992 | Stanaslovich et al. | 257/770 |
| 5,142,432 | 8/1992 | Reinberg et al. | 437/52 |

FOREIGN PATENT DOCUMENTS 57-45968 3/1982 Japan .
62-35562 2/1987 Japan .

OTHER PUBLICATIONS

IEEE Electron Device Letters, vol. 9, No. 4, Apr., 1988 pp. 180–182 L. Manchanda, et al. "Yttrium Oxide/Silicon Dioxide: A New Dielectric Structure".

IEEE Transactions on Election Devices, vol. 37, No. 9, Sep. 1990 pp. 1939–1946 Hiroshi Shinriki, et al. "Promising Storage Capacitor Structures with Thin $Ta_2O_5$ Film".

*Primary Examiner*—Olik Chaudhuri
*Assistant Examiner*—C. Everhart
*Attorney, Agent, or Firm*—Nixon & Vanderhye

[57] ABSTRACT

A semiconductor device comprising a capacitor having a lower electrode of a Si-containing material, an aluminum oxide film formed on the surface of the lower electrode, a dielectric film of $Ta_2O_5$ formed on the aluminum oxide film and an upper electrode provided on the dielectric film.

6 Claims, 1 Drawing Sheet

SEMICONDUCTOR DEVICE AND METHOD FOR PREPARING THE SAME

BACKGROUND OF THE INVENTION

1. Field of the Invention

The invention relates to a semiconductor device and a method for preparing the same, and more particularly to a DRAM made of a material of high dielectric constant and including a capacitor using the material, and method for preparing the DRAM.

2. Description of the Related Art

A capacitor must keep its capacitance at a specified degree as cell sizes are reduced following development of DRAMs of higher density. A material of high dielectric constant and a capacitor construction using the material as well as a stacked capacitor of a larger surface area and a thin film dielectric have been researched in this regard. $Ta_2O_5$ capacitor dielectric film has been given attention as a thin film dielectric of high dielectric constant. But, the $Ta_2O_5$ dielectric film is provided with a lower electrode using a polysilicon film or silicide film (e.g., $WSi_2$), so that it does naturally have $SiO_2$ formed at an interface between $Ta_2O_5$ and polysilicon, leading to deterioration of a practical dielectric constant of the capacitor.

Also, the $Ta_2O_5$ film generally causes high leak current and is difficult to be employed by itself.

SUMMARY OF THE INVENTION

The present invention provides a semiconductor device comprising a capacitor having a lower electrode of a Si-containing material, an aluminum oxide film formed on the surface of the lower electrode, a dielectric film of $Ta_2O_5$ formed on the aluminum oxide film and an upper electrode provided on the dielectric film.

Also, the present invention provides a method for preparing a semiconductor device which comprises;

(i) (a) forming an aluminum or aluminum oxide film on a lower electrode of a Si-containing material, followed by first annealing in a non-oxidative atmosphere, or (b) forming an aluminum or aluminum oxide film on a lower electrode of a Si-containing material upon while conducting the first annealing in non-oxidative atmosphere, (ii) forming a dielectric film of $Ta_2O_5$ on the resulting above mentioned aluminum oxide film, followed by second annealing in an oxidative atmosphere, (iii) and then forming an upper electrode on the dielectric film of $Ta_2O_5$.

DETAILED DESCRIPTION OF THE INVENTION

Figure 1:
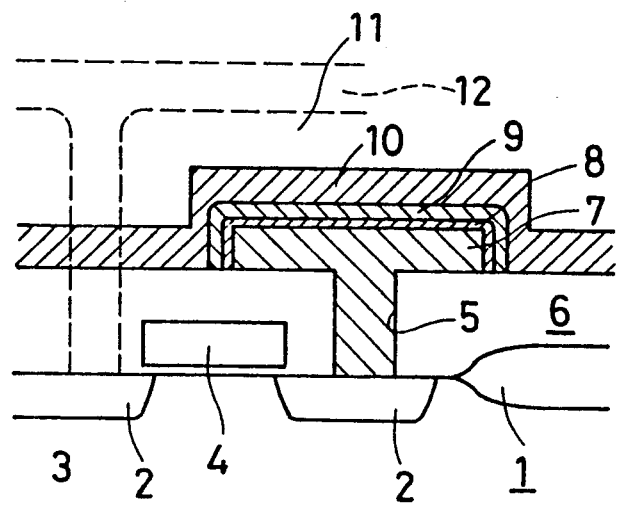
FIG. 1 is a schematic diagram showing a structure of a semiconductor device provided in an example according to the present invention.

According to the present invention, a capacitor is formed on or over a silicon substrate which may provide a transistor element or other elements necessary for constituting a semiconductor device.

The capacitor of the present invention is composed of a lower electrode of a silicone containing material, an aluminum oxide film, a dielectric film of $Ta_2O_5$ and an upper electrode.

The lower electrode can be formed by a conventional method and may be polysilicon, or silicide such as tungsten silicide.

The aluminum oxide film formed on the lower electrode is preferably 10 to 50 Å in thickness. In the production of the semiconductor device according to the present invention, an aluminum (Al) film or aluminum oxide $[Al_2O_X \ (0<X<3)]$ film is initially formed and then converted into an aluminum oxide film $[Al_2O_Y \ (0<Y<3)]$. The aluminum film may be formed by the conventional methods, for example, plasma CVD method using $(CH_3)_2(Al)H$ gas or the like or preferably DC or RF sputtering method using Al target in argon gas since CVD method may restrain temperatures for growth of films. The $Al_2O_x$ film may be also provided by the conventional methods, such as thermal CVD method with $Al(OC_3H_7)_3$ gas or the like or sputtering method using Al target.

The Al film or $Al_2O_x$ film can act to reduce a natural oxide formed through natural oxidation on the lower electrode of a Si-containing material when Al or $Al_2O_x$ changes to $Al_2O_Y$ during first annealing in a non-oxidative atmosphere as describe below.

$Ta_2O_5$ for the dielectric film on the aluminum oxide film is preferably 50 to 250 Å in thickness and may be formed by the conventional methods, such as thermal CVD method sing $Ta(OC_2H_5)_5$ gas, or the like.

In the preparing method according to the present invention, on the lower electrode of a Si-containing material is formed Al or $Al_2O_x(0<x<3)$ film about 10 to 50 Å in thickness, followed by first annealing in a non-oxidative atmosphere to convert the Al or $Al_2O_x(0<x<3)$ film into an aluminum oxide film, or the Al or $Al_2O_x$ film aluminum oxide film is formed about 10 to 50 Å in thickness on the lower electrode of a Si-containing material while conducting the annealing in a non-oxidative atmosphere. The first annealing in a non-oxidative atmosphere is preferably carried out, for example, under nitrogen or hydrogen/nitrogen atmosphere at about 300° to 450° C. for about 10 to 100 mins. The first annealing may remove $SiO_2$, the natural oxide formed on the lower electrode of the Si-containing material, by Al's reduction, resulting in that reaction "$SiO_2$ to Si" by Al is facilitated.

Further, $Ta_2O_5$ is formed about 50 to 250 Å in thickness on the aluminum oxide film, followed by second annealing in an oxidative atmosphere to complete a layered structure of $Ta_2O_5/Al_2O_5$ which is superior in insulation properties. The second annealing is preferably carried out, for example, at about 500° to 800° C. for about 10 to 100 mins in oxygen atmosphere, or at about 300° to 600° C. for about 10 to 100 mins in oxygen or ozone atmosphere, to improve quality of $Ta_2O_5$ film.

Next, examples of the present invention will be detailed with referring to the accompanied drawings.

Figure 2:
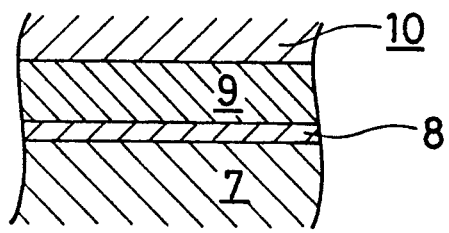
FIG. 2 is a schematic diagram showing a structure of a principal portion of a capacitor of the example.
Figure 3:
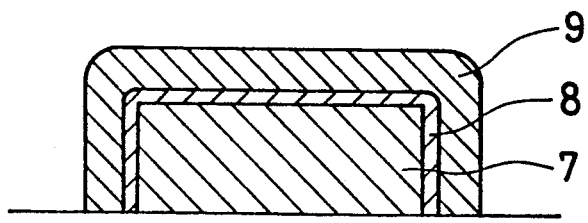
FIG. 3 is a schematic diagram showing a structure of a capacitor of the example.

As shown in FIG. 1, the semiconductor device comprises a substrate 3 made of silicon and having thereon LOCOS 1 serving as an interlayer film and n+diffused layers 2, a word line 4 providing a gate, an interlayer dielectric film 6 having a contact hole 5 communicated with one of the n+diffused layers 2, a polysilicon film 7 filling the contact hole 5 and serving as a lower electrode for the capacitor, an aluminum oxide film 8 (FIG. 2), $Ta_2O_5$ film 9 (FIG. 2), a polysilicon film 10 providing an upper electrode for the capacitor, and an interlayer dielectric film 11 separating a bit line 12 from the capacitor. The capacitor is composed of the polysilicon film 7, the $Ta_2O_5$ film 9, the $Al_2O_x$ film 8 interposed therebetween and the polysilicon film 10, as shown. FIG. 3 shows a principal portion of the capacitor.

Next, a method for preparing the semiconductor device will be detailed.

EXAMPLES 1 AND 2

The examples use the polysilicon film 7 for the lower electrode as shown in FIG. 1.

<Step 1>

Al film 8 having thickness of 10 Å was deposited on the polysilicon film 7 by plasma CVD method using $(CH_3)_2(Al)H$ gas.

For the other example, $(Al)_2O_x$ film 8 having thickness of 20 Å was deposited on the polysilicon film 7 by thermal CVD method using $Al(OC_3H_7)_3$ gas.

$Al/SiO_2$/polysilicon or $(Al)_2O_x/SiO_2$/polysilicon was then completed.

<Step 2>

The polysilicon film 7 having the Al film 8 was subjected to the first annealing in $N_2$ atmosphere at 400° C. for 1 hr.

The another polysilicon film 7 having the $(Al)_2O_x$ film 8 was subjected to the first annealing in $N_2/H_2$ atmosphere at 400° C. for 1 hr.

As a result, either case formed $Al_2O_3$/polysilicon.

<Step 3>

$Ta_2O_5$ film 9 was deposited 200 Å on the Al film 8 and $Al_2O_3$ film 8 by thermal CVD method using $Ta(OC_2H_5)_5$ gas. $Ta_2O_5/Al_2O_3$/polysilicon was then completed.

<Step 4>

The second annealing was carried out in oxygen atmosphere at 800° C. for 1 hr to improve quality of the $Ta_2O_5$ film 9.

EXAMPLES 3 AND 4

<Step 1>

With the temperature of wafer increased to 400° C., Al film 8 and $Al_2O_x$ film 8 each having thickness of approximately 10 Å were formed on respective polysilicon films 7, provided in the same manner as of the Examples 1 and 2, by RF sputtering method using Al target, and Ar gas or $Ar+O_2$ gas, respectively. In this step, $Al_2O_3$/polysilicon appeared on the polysilicon films 7.

<Step 2>

$Ta_2O_5$ film 9 was deposited approximately 200 Å on the Al film 8 and $Al_2O_x$ film 8 by thermal CVD method using $Ta(OC_2H_5)_5$ gas. $Ta_2O_5/Al_2O_3$/polysilicon was then completed.

<Step 3>

The second annealing was carried out in oxygen atmosphere at 800° C. for 1 hr to improve quality of $Ta_2O_5$ film 9. $Ta_2O_5/Al_2O_3$/polysilicon was then completed.

EXAMPLES 5 AND 6

The examples used $WSi_2$ for the lower electrode to form $Ta_2O_5/Al_2O_3$/polysilicon structure in the same manner as of the examples 1 and 2.

EXAMPLES 7 AND 8

The examples used $WSi_2$ for the lower electrode to form $Ta_2O_5/Al_2O_3$/polysilicon structure in the same manner as of the examples 3 and 4.

The above method for preparing a semiconductor device achieved a capacitor dielectric film which has low dielectric constant 4 or less and does not have $SiO_2$ film. In detail, capacitance of $Ta_2O_5/Al_2O_3$ structures of the capacitors provided by the methods of Examples 1 to 8 with 100 Å of $Ta_2O_5$ (dielectric constant $[\epsilon]=24$) and 30 Å of $Al_2O_3$ (dielectric constant $[\epsilon]=8$) is higher 1.4 times than that of $Ta_2O_5/Al_2O_3/SiO_2$ structures with 100 Å of $Ta_2O_5$ (dielectric constant $[\epsilon]=24$), 30 Å of $Al_2O_3$ (dielectric constant $[\epsilon]=8$) and 20 Å of $SiO_2$ film (dielectric constant $[\epsilon]=4$).

Also, $Ta_2O_5$ which is usually likely to have higher leak current is provided in the form of a thin film of high dielectric properties, thereby enabling leak current to be reduced. Hence, $Ta_2O_5$ together with $Al_2O_3$ also of high dielectric properties provide the $Ta_2O_5/Al_2O_3$ structure of excellent dielectric properties.

What we claim is:

1. A method for preparing a semiconductor device comprising:
   (i)
      (a) forming an aluminum or aluminum oxide film on a lower electrode of a Si-containing material,
      (b) performing a first annealing in a non-oxidative atmosphere whereby oxide film occurring on a surface of the lower electrode is reduced with aluminum or aluminum oxide,
   (ii) forming a dielectric film of $Ta_2O_5$ on the resulting aluminum oxide film, followed by second annealing in an oxidative atmosphere, and then
   (iii) forming an upper electrode on the dielectric film.

2. A method for preparing a semiconductor device as set forth in claim 1, wherein the first annealing is carried out at about 300° to 450° C. for about 10 to 100 mins in a non-oxidative atmosphere of $N_2$ or $N_2/N_2$ gas at about 300° to 450° C.

3. A method for preparing a semiconductor device as set forth in claim 1, wherein the second annealing is carried at about 500° to 800° C. for about 10 to 100 mins in oxygen atmosphere, or at about 300° to 600° C. for about 10 to 100 mins in oxygen or ozone atmosphere applying UV beam.

4. A method for preparing a semiconductor device as set forth in claim 1, wherein the step of forming the aluminum or aluminum oxide film on a lower electrode is conducted while conducting the first annealing.

5. A method for preparing a semiconductor device as set froth in claim 1, wherein the step of forming the aluminum or aluminum oxide film on a lower electrode is conducted prior to conducting the first annealing.

6. A method for preparing a semiconductor device as set forth in claim 1, wherein the aluminum oxide film is formed 10 to 50 Å in thickness and the dielectric film is formed 50 to 250 Å in thickness.

* * * * *